United States Patent
Kim

(10) Patent No.: US 9,000,729 B2
(45) Date of Patent: Apr. 7, 2015

(54) METHOD AND APPARATUS FOR BATTERY GAUGING IN A PORTABLE TERMINAL USING AMOLED DISPLAY

(71) Applicant: Samsung Electronics Co., Ltd., Gyeonggi-do (KR)

(72) Inventor: Jin-Kyu Kim, Daegu (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 261 days.

(21) Appl. No.: 13/675,222

(22) Filed: Nov. 13, 2012

(65) Prior Publication Data

US 2013/0119997 A1    May 16, 2013

(30) Foreign Application Priority Data

Nov. 14, 2011    (KR) .................. 10-2011-0118543

(51) Int. Cl.
*H01M 10/44* (2006.01)
*H01M 10/46* (2006.01)
*G01R 31/36* (2006.01)
*G09G 3/32* (2006.01)

(52) U.S. Cl.
CPC ............ *G01R 31/362* (2013.01); *G09G 3/3225* (2013.01); *G01R 31/3651* (2013.01); *G01R 31/3682* (2013.01); *G09G 2320/04* (2013.01); *G09G 2330/021* (2013.01)

(58) Field of Classification Search
USPC .......... 320/107, 114, 115, 132, 149; 324/426, 324/427, 433; 345/204, 211, 212, 77
See application file for complete search history.

(56) References Cited

U.S. PATENT DOCUMENTS

| | | | |
|---|---|---|---|
| 2011/0181599 A1* | 7/2011 | Cho et al. ...................... | 345/440 |
| 2011/0195723 A1* | 8/2011 | Kim et al. .................. | 455/456.1 |
| 2011/0200267 A1* | 8/2011 | Hayaishi ...................... | 382/254 |
| 2013/0119998 A1* | 5/2013 | Roh et al. ...................... | 324/427 |
| 2013/0141415 A1* | 6/2013 | Kim ............................. | 345/212 |

\* cited by examiner

*Primary Examiner* — Edward Tso
(74) *Attorney, Agent, or Firm* — Cha & Reiter, LLC.

(57) ABSTRACT

Provided is a battery gauging method for a portable terminal including an active matrix organic light emitting diode (AMOLED) display. The battery gauging method may measure a voltage value of a battery, may determine, for each pixel, RGB information associated with image data buffered in a frame buffer, may determine, for each pixel, a preliminary compensation value corresponding to determined RGB information so as to calculate a compensation value by adding preliminary compensation values of all pixels, and then determine a residual quantity of the battery based on the measured voltage value and the compensation value.

18 Claims, 6 Drawing Sheets

|      | 0 - 3bit | 4 - 7bit | 8 - 11bit | 12 - 15bit | 16 - 19bit | 20 - 23bit |
|------|----------|----------|-----------|------------|------------|------------|
| 0x0  | 0        | 0        | 0         | 0          | 0          | 0          |
| 0x1  | 2        | 29       | 4         | 3          | 3          | 30         |
| 0x2  | 3        | 2        | 8         | 4          | 3          | 3          |
| 0x3  | 4        | 30       | 17        | 6          | 4          | 30         |
| 0x4  | 5        | 2        | 24        | 7          | 5          | 3          |
| 0x5  | 6        | 31       | 35        | 9          | 7          | 30         |
| 0x6  | 8        | 3        | 50        | 13         | 9          | 3          |
| 0x7  | 10       | 31       | 68        | 17         | 10         | 32         |
| 0x8  | 11       | 3        | 3         | 18         | 11         | 3          |
| 0x9  | 13       | 31       | 6         | 22         | 13         | 31         |
| 0xA  | 14       | 4        | 10        | 24         | 15         | 5          |
| 0xB  | 17       | 31       | 18        | 29         | 17         | 32         |
| 0xC  | 19       | 4        | 25        | 34         | 19         | 4          |
| 0xD  | 22       | 32       | 35        | 39         | 22         | 32         |
| 0xE  | 24       | 6        | 51        | 46         | 25         | 6          |
| 0xF  | 28       | 33       | 69        | 52         | 28         | 33         |

FIG.4

HOME SCREEN

MAIN MENU SCREEN

ALARM SCREEN

GOOGLE SCREEN

| TYPES OF SCREEN | COMPENSATION VALUE | COMPENSATION VOLTAGE VALUE(mV) |
|---|---|---|
| WHITE SCREEN | 93,312,000 | 150 |
| BLACK SCREEN | 0 | 0 |
| HOME SCREEN | 36,977,156 | 100 |
| MAIN MENU SCREEN | 14,579,561 | 90 |
| ALARM SCREEN | 10,155,450 | 85 |
| GOOGLE SCREEN | 63,519,976 | 140 |

FIG.6

| BATTERY LEVEL | IMAGE | RESIDUAL QUANTITY OF BATTERY(mV) |
|---|---|---|
| LOW |  | 3400 |
| LEVEL_1 |  | 3550 |
| LEVEL_2 |  | 3690 |
| LEVEL_3 |  | 3730 |
| LEVEL_4 |  | 3770 |
| LEVEL_5 |  | 3850 |
| LEVEL_6 |  | 3950 |
| FULL |  | 4200 |

FIG.7

METHOD AND APPARATUS FOR BATTERY GAUGING IN A PORTABLE TERMINAL USING AMOLED DISPLAY

CLAIM OF PRIORITY

This application claims the priority under 35 U.S.C. §119 (a) of an application entitled "Method And Apparatus For Battery Gauging In A Portable Terminal Using AMOLED Display" filed in the Korean Intellectual Property Office on Nov. 14, 2011 and assigned Serial No. 10-2011-0118543, the contents of which are hereby incorporated by reference.

BACKGROUND OF THE INVENTION

1. Field of the Invention

The present invention relates to a portable terminal, and more particularly to, a method and apparatus for gauging a battery in a portable terminal of the type having an active matrix organic light emitting diode (AMOLED) display.

2. Description of the Related Art

A smart phone usage has been increasingly growing as it provides more various functions when compared to a conventional phone.

As the amount of time the portable terminal is utilized by the user increases, an amount of battery consumed by the portable terminal increases. To this end, the portable terminal may display, to the user, a residual quantity of the battery via an indicator bar and the like, so as to enable the user to control the use of the portable terminal.

Recently, a controlling device of the portable terminal, for example, a controller or a central processing unit (CPU), has been developed to utilize multiple cores or processors, thus the size of a displaying device has been increased which in turn causes more battery consumption. Especially, the battery consumption due to the displaying device has been increasingly growing. Hence, the amount of the battery consumed for driving the displaying device may need to be accurately measured first, so as to accurately inform the user of the residual quantity of the battery.

In general, a process of measuring the residual quantity of the battery of a portable terminal may be referred to as battery gauging. Conventionally, battery gauging has been performed by converting an analog voltage value of the battery into a digital voltage value through use of an analog-to-digital converter (ADC) included in the controlling device.

The portable terminal may need to include a displaying device having a high resolution and definition, for example, an AMOLED display. The AMOLED display may provide a wide angle of view, a clear color, and the like. However, the AMOLED display has a drawback in that it consumes a different amount of power for each color. That is, the portable terminal equipped with the AMOLED display may have a rapid change in power consumption for each color represented by the AMOLED display. Accordingly, when the portable terminal performs battery gauging through use of the ADC included in the controlling device, battery gauging may not be accurately performed. Consequently, when the battery gauging is inaccurate, the residual quantity of the battery may be inaccurately displayed to the user.

To overcome the drawbacks, the portable terminal equipped with the AMOLED display as a displaying device may include a separate battery gauging device, for example, a gauge integrated circuit (IC) chip, so as to perform battery gauging by reflecting that a power consumption rate of the displaying device is rapidly changed. However, the separate battery gauging device may require a separate space in which the separate battery gauging device is to be contained. As such, it may adversely affect the cost and the design of the portable terminal, for example, a size and a thickness of the portable terminal.

Accordingly, there is a need for a portable terminal equipped with the AMOLED display to perform the battery gauging accurately without using the separate battery gauging device.

SUMMARY OF THE INVENTION

Accordingly, an aspect of the present invention is to solve the above-mentioned problems occurring in the prior art and provides additional advantages, by providing a method and apparatus for accurately performing battery gauging in a portable terminal, which includes an active matrix organic light emitting diode (AMOLED) as a displaying device for displaying the battery gauging outcome, through use of an analog-to-digital converter (ADC) included in a controller without using a separate battery gauging device.

In accordance with an aspect of the present invention, a battery gauging method for a portable terminal including an AMOLED display includes: measuring a voltage value of the battery, determining, RGB information associated with image data buffered in a frame buffer for each pixel, determining a preliminary compensation value corresponding to determined RGB information for each pixel, and calculating a compensation value by adding preliminary compensation values of all pixels, and determining a residual quantity of the battery based on the measured voltage value and the compensation value.

In accordance with another aspect of the present invention, a battery gauging apparatus in a portable terminal having an AMOLED display, a memory including a frame buffer, and a controller to perform controlling, so as to measure a voltage value of the battery, to determine a preliminary compensation value by determining RGB information associated with image data buffered in the frame buffer for each pixel, to calculate a compensation value by adding preliminary compensation values of all pixels, and to determine a residual quantity of the battery based on the measured voltage value and the compensation value.

In accordance with yet another aspect of the present invention, a portable terminal having a display of the type having an active matrix organic light emitting diode (AMOLED) panel and a battery includes: a memory having a frame buffer; and a controller for measuring a voltage value of the battery to determine a preliminary compensation value by determining RGB information associated with image data buffered in the frame buffer for each pixel, for calculating a compensation value by adding preliminary compensation values of all pixels, and for determining a residual quantity of a battery based on the measured voltage value and the compensation value.

The teachings of present invention enablers an accurate performance of battery gauging without using a separate battery gauging device in a portable terminal type having an active matrix organic light emitting diode (AMOLED) panel as a display device.

BRIEF DESCRIPTION OF THE DRAWINGS

The above and other aspects, features and advantages of the present invention will be more apparent from the following detailed description taken in conjunction with the accompanying drawings, in which:

FIG. 4 is a diagram illustrating a battery gauging method for a portable terminal including an AMOLED display according to an exemplary embodiment of the present invention;

FIG. 6 is a diagram illustrating a battery gauging method for a portable terminal including an AMOLED display according to an exemplary embodiment of the present invention; and FIG. 7 is a diagram illustrating a battery gauging method for a portable terminal including an AMOLED display according to an exemplary embodiment of the present invention.

DETAILED DESCRIPTION

Hereinafter, exemplary embodiments of the present invention will be described with reference to the accompanying drawings.

Figure 1:
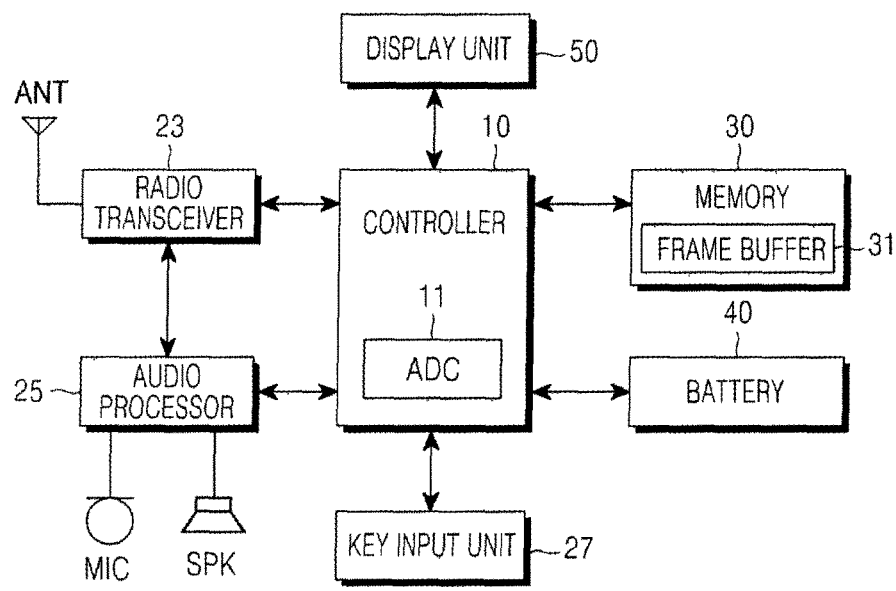
FIG. 1 is a block diagram illustrating a portable terminal according to an exemplary embodiment of the present invention.

FIG. 1 illustrates a portable terminal according to an exemplary embodiment of the present invention. As shown, the portable terminal may include a controller 10, a radio transceiver 23, an audio processor 25, a key input unit 27, a memory 30, a battery 40, and a display unit 50.

A portable terminal according to exemplary embodiments of the present invention may be a portable electronic device, for example, a videophone, a feature phone, a smart phone, an International Mobile Telecommunication 2000 (IMT-2000) terminal, a Wideband Code Division Multiple Access (WCDMA) terminal, a Universal Mobile Telecommunication Service (UMTS) terminal, a Personal Digital Assistant (PDA), a Portable Multimedia Player (PMP), a Digital Multimedia Broadcasting (DMB) terminal, a portable game console, and the like.

Referring to FIG. 1, a radio transceiver 23 may include a radio frequency (RF) unit and a modem. The RF unit may include an RF transmitter to perform up-conversion and amplification of a frequency of a transmitted signal, an RF receiver to perform low noise amplification of a received signal and low-conversion of a frequency, and the like. The modem may include a transmitter to encode and modulate a signal to be transmitted, a receiver to demodulate and decode a signal received from the RF unit, and the like.

An audio processor 25 may configure a codec, and the codec may include a data codec and an audio code. The data codec may process packet data and the like, and the audio codec may process an audio signal such as a voice, a multimedia file, and the like. The audio processor 25 may convert a digital audio signal received from the modem into an analog signal through use of the audio codec so as to play back the analog signal, or may convert an analog audio signal generated from a microphone into a digital audio signal through use of the audio code so as to transmit the digital audio signal to the modem. The codec may be included separately, or may be included in a controller 10.

When battery gauging is completed, the audio processor 25 may output, to a user in a form of sound information, a residual quantity of a battery corresponding to a result of battery gauging.

A key input unit 27 may include keys for inputting number and character information, functional keys for setting varied types of functions, a touch pad, and the like. When a display unit 50 is embodied by a touch screen, for example, a capacitive touch screen, a resistive touch screen, or the like, the key input unit 27 may include predetermined keys at the minimum, thus the display unit 50 may be substituted for a part of a key input function of the key input unit 27.

A memory 30 may include a program memory and a data memory. The program memory may store a program for controlling a general operation of the portable terminal. The memory 30 may further include an external memory, for example, a compact flash (CF) memory, a secure digital (SD) memory, a micro-secure digital (micro-SD) memory, a mini secure digital (mini-SD) memory, an extreme digital (xD) memory, a memory stick, and the like. Also, the memory 30 may include a disk, for example, a hard disk drive (HDD), a solid state disk, and the like.

Also, the memory 30 may include a frame buffer 31 that may be configured as a volatile memory, and may be used for buffering or caching data required for an operation of the portable terminal. The frame buffer 31 may be used for buffering image data to be displayed by the display unit 50.

A battery 40 may provide power that enables the portable terminal to operate, through a power supply terminal (not illustrated), a switching terminal (not illustrated), and the like. The power supply terminal may be used to supply power to a body of the portable terminal, and the switching terminal may be used to check a state of coupling between the battery 40 and the portable terminal For example, when the switching terminal is configured as a current feedback terminal, the controller 10 may determine whether the battery 40 is coupled with the portable terminal based on whether a current feedback signal is detected.

The display unit 50 may be configured as a liquid crystal display, or an organic light emitting diode (OLED) display, for example, a passive-matrix organic light emitting diode (PMOLED) display, an AMOLED display, and the like, and may output various display information generated by the portable terminal. The display unit 50 function as an input unit that controls the portable terminal, along with the key input unit 27.

In general, a displaying device of the portable terminal, that is, the display unit 50, may be configured to include a driver, for example, an LCD driver integrate circuit (IC) (LDI) and a display driver IC (DDI), a panel, a flexible printed circuit board (FPCB), a back light, and the like. In the embodiment, it is assumed that a panel of the displaying device of the portable terminal, that is, a panel of the display unit 50, is an AMOLED panel and excludes a back light.

The driver (not illustrated) of the display unit 50 may apply a driving signal to a panel, for example, an OLED, and may transmit display information or image data to the panel, so as to display characters, an image, and the like on a display screen. In this example, the display information transmitted by the driver to the panel may be buffered in the frame buffer 31 and may be transmitted to the driver according to the control of the controller 10. That is, the controller 10 may perform controlling, to perform buffering the display information through use of the frame buffer 31 and to transmit the buffered display information to the driver of the display unit 50, so that various display information may be displayed or output through the display unit 50.

The controller 10 may control an overall operation of the portable terminal, and may convert and control the operation of the portable terminal based on a user input that is input through the key input unit 27, the display unit 50, or the like. The controller 10 may include an analog-to-digital converter (ADC) 11. The controller 10 may measure a voltage value of power, for example, a voltage, supplied from the battery 40 and may convert the measured voltage value into a digital value through use of the ADC 11, may determine a residual quantity of the battery 40 based on the digital value, and may inform the user of the residual quantity of the battery 40 in a form of visual information or auditory information.

As discussed earlier, as the display unit 50 utilizes an AMOLED panel of which a power consumption rapidly varies for each represented color, it is difficult to accurately determine a residual quantity of the battery 40. Accordingly, the controller 10 may control an operation of determining, in advance, a color of the display information or the image data to be represented through the display unit 50, so as to accurately determine the residual quantity of the battery 40. To this end, the controller 10 may perform measuring a voltage value of the battery 40, determining, for each pixel, RGB information associated with the image data buffered in the frame buffer 31, determining, for each pixel, a preliminary compensation value corresponding to determined RGB information, calculating a compensation value by adding preliminary compensation values of all pixels, and determining a residual quantity of the battery 40 based on the measured voltage value and the compensation value. A detailed explanation of operation steps according to the embodiments of the present invention will be described hereinafter with reference to FIGS. 2-7.

Figure 2:
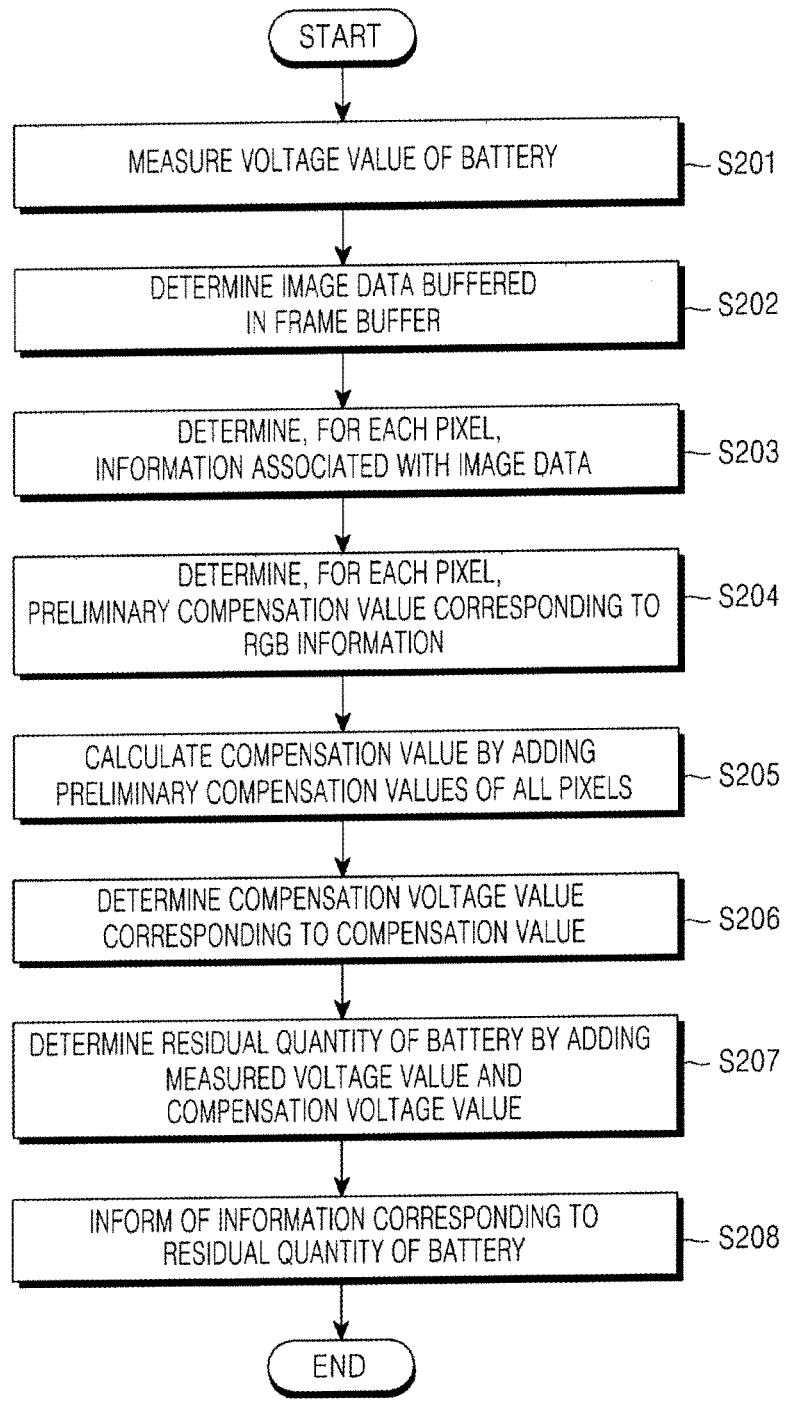
FIG. 2 is a flowchart illustrating a battery gauging method for a portable terminal including an active matrix organic light emitting diode (AMOLED) display according to an exemplary embodiment of the present invention.

FIG. 2 illustrates an inventive battery gauging method for a portable terminal including an AMOLED display according to an exemplary embodiment of the present invention. FIGS. 3 through 7 illustrate examples of battery gauging methods for a portable terminal including an AMOLED display according to first through fifth exemplary embodiments of the present invention.

In operation S201 through S203, the controller 10 may measure a voltage value of the battery 40 at predetermined intervals, for example, at 5 seconds intervals, and may determine image data buffered in a frame buffer so as to determine, for each pixel, RGB information associated with the image data.

To achieve above, the controller 10 may convert an analog value supplied from the battery 40 into a digital value through use of the ADC 11, so as to measure a voltage value of the battery 40. Conventionally, a residual quantity of the battery 40 is measured merely based on the measured voltage value of the battery 40, thus a detailed description of such a known method is omitted for simplicity.

However, after measuring the voltage value of the battery 40, the controller 10 may determine the image data that are being buffered in the frame buffer of the memory 30, for example, raw data to be displayed through the display unit 50, so as to check into the image data to be displayed on the display unit 50 before displaying the image data on the display unit 50.

Thereafter, the controller 10 may determine RGB information associated with the image data buffered in the frame buffer, and may determine color components of the image data to be output through the display unit 50. Accordingly, a characteristic of the AMOLED display that consumes different amounts of power for each represented color may be reflected during S201 through S203.

Figure 3:
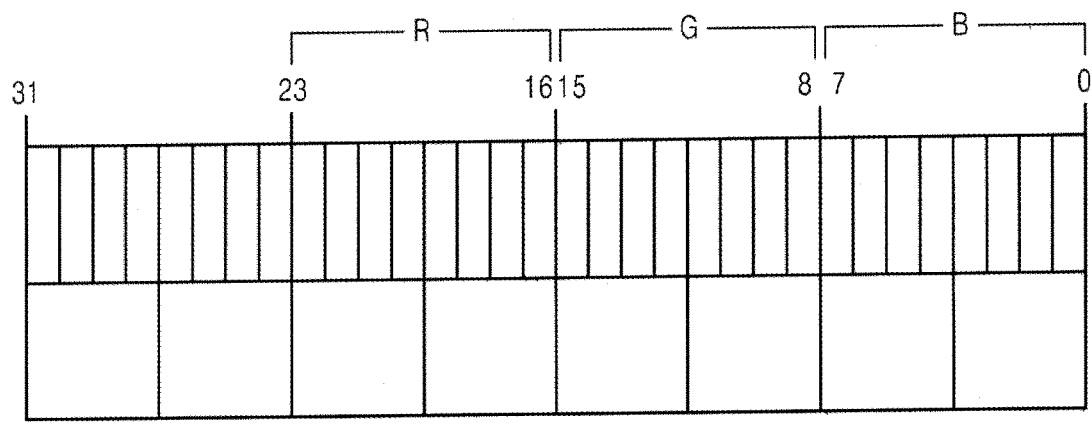
FIG. 3 is a diagram illustrating a battery gauging method for a portable terminal including an AMOLED display according an exemplary embodiment of the present invention.

For example, referring to FIG. 3, the image data buffered in the frame buffer may have, for each pixel, the size of 32 bits from a $0^{th}$ bit to a $31^{st}$ bit. In the image data of 32 bits, 24 bits from the $0^{th}$ bit to a $23^{rd}$ bit may substantially have color information. Bits from the $0^{th}$ bit to a $7^{th}$ bit may have information associated with a B component corresponding to a blue color. Bits from an $8^{th}$ bit to a $15^{th}$ bit may have information associated with a G component corresponding to a green color. Bits from a $16^{th}$ bit to the $23^{rd}$ bit may have information associated with an R component corresponding to a red color.

Accordingly, when the controller 10 determines, for each pixel, RGB information associated with the image data buffered in the frame buffer for determining RGB information. For promptly determining and calculating a preliminary compensation value, a compensation value, and a compensation voltage value, the controller 10 therefore determines, for each pixel, information associated bits from a $0^{th}$ bit to a $23^{rd}$ bit.

In operations S204 and S205, the controller 10 may determine or calculate a preliminary compensation value corresponding to RGB information of each pixel, and then calculate a compensation value by adding preliminary compensation values of all pixels.

For example, the controller 10 may determine, for each pixel, a preliminary compensation value corresponding to RGB information associated with the image data buffered in the frame buffer, based on a preliminary compensation value table as illustrated in FIG. 4.

With respect to a plurality of pixels corresponding to a resolution of the display unit 50, that is, a resolution of the AMOLED panel, the image data buffered in the frame buffer may include RGB information for each pixel. For example, when the display unit 50 has a resolution of 800×480, a total number of pixels may be 384,000, and the image data buffered in the frame buffer may have RGB information for each of the 384,000 pixels.

When RGB information of a pixel from among the plurality of pixels of the image data buffered in the frame buffer includes information associated with a white color, values of R, G, and B corresponding to the white color may correspond to a decimal number 255, and 255 may correspond to a hexadecimal number FF.

Accordingly, in a case where RGB information of a predetermined pixel has information associated with a white color, when a $16^{th}$ bit through a $19^{th}$ bit and a $20^{th}$ bit through a $23^{rd}$ bit corresponding to R have values of FF, an $8^{th}$ bit through an $11^{th}$ bit and a $12^{th}$ bit through a $15^{th}$ bit corresponding to G have values of FF, and a $0^{th}$ bit through a $3^{rd}$ bit and a $4^{th}$ bit through a $7^{th}$ bit corresponding to B have values of FF, the controller 10 may obtain a preliminary compensation value corresponding to the RGB information of the corresponding pixel, based on 28, 33, 69, 52, 28, and 33 in the preliminary compensation value table of FIG. 4.

When the display unit 50 has a resolution of 800×480, and all pixels of the image data buffered in the frame buffer have information associated with a white color, for example, a white screen, a preliminary compensation value of a pixel may be calculated to be 243 by adding 33, 69, 52, 28, and 33, and a compensation value may be calculated to be 93,312,000 by multiplying 243 by 384,000 corresponding to the number of pixels.

Figure 5:
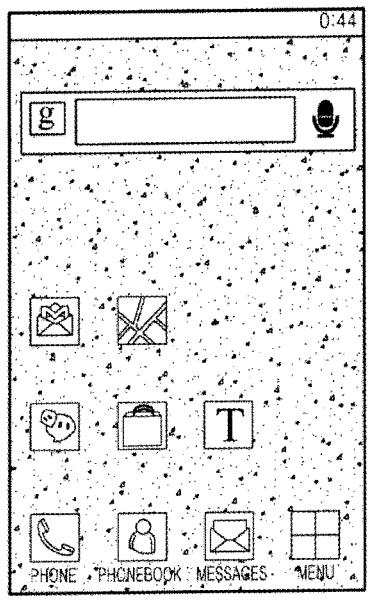
FIG. 5 is a diagram illustrating a battery gauging method for a portable terminal including an AMOLED display according to an exemplary embodiment of the present invention.
Figure 5:
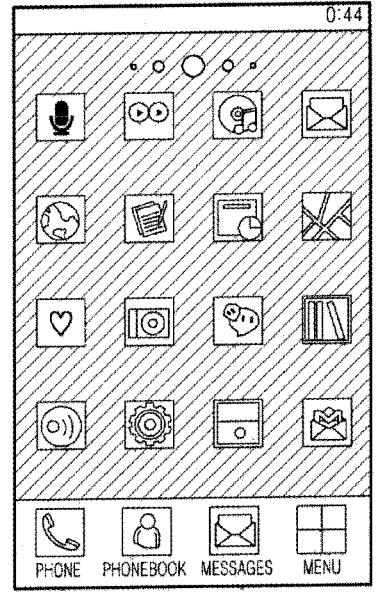
Figure 5:
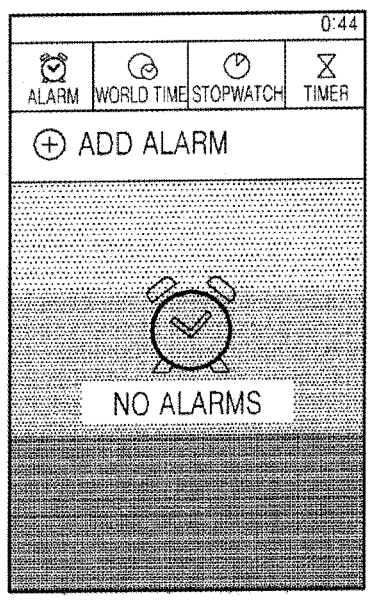
Figure 5:
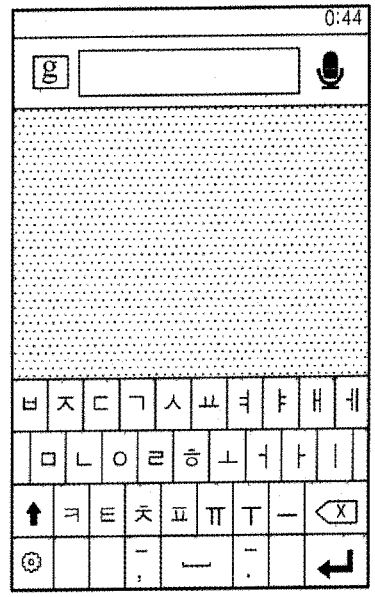

Referring to FIG. 5, the display unit 50 may display various screens based on manipulation of the portable terminal by the user. As shown, the display unit may display a home screen, a main menu screen, an alarm screen, and a Google search screen.

When a process of calculating a compensation value is applied to the examples of the screen as shown in FIG. 5, a black screen, and a white screen, compensation values of 93,312,000, 0, 36,977,156, 14,579,561, 10,155,450, and 63,519,976 may be obtained as shown in FIG. 6. The compensation values of FIG. 6 may be changed based on a resolution of the display unit 50.

Operations S202 through S205 may be embodied through a source code as following. The source code is applied to a resolution of 800×480, and the source code may be appropriately changed based on a resolution.

According to a result of a simulation through use of the source code in the resolution of 800×480, it takes about 250 milliseconds (ms) to calculate a compensation value from RGB information of each pixel of image data to be displayed on the display unit 50, that is, the image data buffered in the frame buffer, and there is less delay time when compared to a conventional method that determines a residual quantity of a battery merely based on a voltage value of the battery.

```
static int one_bit_Value[16] = {
0,2,3,4,5,6,8,10,11,13,14,17,19,22,24,28};
static int two_bit_Value[16] = {
0,29,2,30,2,31,3,31,3,31,4,31,4,32,6,33};
static int three_bit_Value[16] = {
0,4,8,17,24,35,50,68,3,6,10,18,25,35,51,69};
static int four_bit_Value[16] = {
0,3,4,6,7,9,13,17,18,22,24,29,34,39,46,52};
static int five_bit_Value[16] = {
0,3,3,4,5,7,9,10,11,13,15,17,19,22,25,28};
static int six_bit_Value[16] = {
0,30,3,30,3,30,3,32,3,31,5,32,4,32,6,33};
printk("#### BATTERY FrameBuffer_Data Read + ### \n");
while(1){
    FrameBuffer_Data_u32
        = readl(fb_first_base+FrameBuffer_Read_Offset);
    FrameBuffer_Read_Offset += 0x4;
for(i=0;i<=20;i+=4)
{
    Temp_FrameBuffer_Data_u32 = FrameBuffer_Data_u32;
    Temp_FrameBuffer_Data_u32 =
    (Temp_FrameBuffer_Data_u32 >>i)&0x0000000F;
    index = Temp_FrameBuffer_Data_u32;
    switch(i)
    {
        case 0: // 0bit
            Lcd_Compensation += one_bit_Value[index];
            break;
        case 4: // 1bit
            Lcd_Compensation += two_bit_Value[index];
            break;
        case 8: // 2bit
            Lcd_Compensation += three_bit_Value[index];
            break;
        case 12: // 3bit
            Lcd_Compensation += four_bit_Value [index];
            break;
        case 16: // 4bit
            Lcd_Compensation += five_bit_Value[index];
            break;
        case 20: // 5bit
            Lcd_Compensation += six_bit_Value[index];
            break;
        default:
            printk("Other Buffer Level Skip \n ");
            break;
    }
}
if(FrameBuffer_Read_Offset >= LCD_FRAME_BUFFER_SIZE)
{
    break;
}
}
``` printk("####BATTERYLcd_Compensation=%d### n",Lcd_Compensation)
printk("#### BATTERY FrameBuffer_Data Read - ### \n");

In operations S206 through S208, the controller 10 may determine a compensation voltage value corresponding to the calculated compensation value, may determine a residual quantity of the battery 40 by adding the measured voltage value of the battery 40 and the compensation voltage value, and may inform the user of information corresponding to the determined residual quantity of the battery 40.

When the compensation value is calculated through the operations described in the foregoing, the controller 10 may determine the compensation voltage value corresponding to the compensation value, based on a compensation voltage value table stored in memory 30, as illustrated in FIG. 6. Note that a compensation voltage value table is a look up table, so the compensation value can be assigned by referring a look up table stored in memory 30 as illustrated FIG. 6. For example, when a home screen is displayed through manipulation of the portable terminal by the user, the controller 10 may calculate a compensation value of 36,977,156, and may determine a compensation voltage value of 150 millivolt (mV) corresponding to the home screen, based on the compensation voltage value table as illustrated in FIG. 6. Subsequently, the controller 10 may determine the residual quantity of the battery 40 based on a voltage value obtained by adding the measured voltage value of the battery 40 and the compensation voltage value. For example, when the voltage value of the battery 40 measured in operation S201 is 3400 mV and the compensation voltage value is 150 mV, the residual quantity of the battery 40 may be determined based on a voltage value of 3550 mV.

When the residual quantity of the battery 40 is determined, the controller 10 may inform the user of the residual quantity of the battery 40 in at least one form of visual information and auditory information.

For example, when the residual quantity of the battery 40 is assumed to be visually displayed based on eight levels including Low, Levels 1 through 6, and Full, the controller 10 may display the residual quantity of the battery 40, through use of an image corresponding to a level of the residual quantity of the battery 40 determined as illustrated in FIG. 7. Here, the image corresponding to the residual quantity of the battery 40 may be represented through use of an indicator bar. Also, the residual quantity of the battery 40 may be represented by a separate display window, a widget, an application, and the like.

The residual quantity of the battery 40 may be provided to the user in a form of auditory information, such as sound information, separately from or along with the visual information provided through use of the corresponding image.

For example, the controller 10 may perform controlling to enable the residual quantity of the battery 40 to be output, to the user, in a form of sound information through an internal speaker (not illustrated) or an external speaker (not illustrated), such as an ear phone and the like, of the portable terminal.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of gauging a battery in a portable terminal of the type having an active matrix organic light emitting diode (AMOLED) display, the method comprising:
    measuring, by a controller, a voltage value of the battery;
    determining, by the controller, RGB information associated with image data buffered in a frame buffer for each pixel;
    determining, by the controller, a preliminary compensation value corresponding to determined RGB information for each pixel, and calculating a compensation value by adding preliminary compensation values of all pixels; and
    determining, by the controller, a residual quantity of the battery based on the measured voltage value and the calculated compensation value.

2. The method of claim 1, wherein determining of the RGB information comprises:
    determining data from a $0^{th}$ bit to a $23^{rd}$ bit from among data from the $0^{th}$ bit to a $32^{nd}$ bit of each pixel of the buffered image data; and
    determining, for each pixel, information associated with B based on data from the $0^{th}$ bit to a $7^{th}$ bit, information associated with G based on data from an $8^{th}$ bit to a $15^{th}$ bit, and information associated with R based on data from a $16^{th}$ bit to the $23^{rd}$ bit.

3. The method of claim 2, wherein the preliminary compensation value is obtained by adding values set, based on a four-bit unit, with respect to the data from the $0^{th}$ bit to the $23^{rd}$ bit.

4. The method of claim 1, wherein determining of the residual quantity of the battery comprises:
    determining a compensation voltage value corresponding to the compensation value based on a predetermined table; and
    determining the residual quantity of the battery by adding the measured voltage value and the compensation voltage value.

5. The method of claim 1, further comprising:
    informing information corresponding to the determined residual quantity of the battery.

6. The method of claim 5, wherein the information includes at least one of visual information and auditory information.

7. An apparatus for gauging a battery in a portable terminal, comprising:
    a display unit including an active matrix organic light emitting diode (AMOLED) panel; and
    a controller for measuring a voltage value of the battery to determine a preliminary compensation value by determining RGB information associated with image data buffered in a frame buffer for each pixel, for calculating a compensation value by adding preliminary compensation values of all pixels, and for determining a residual quantity of a battery based on the measured voltage value and the compensation value.

8. The apparatus of claim 7, wherein the controller performs:
    determining of data from a $0^{th}$ bit to a $23^{rd}$ bit from among data from the $0^{th}$ bit to a $32^{nd}$ bit of each pixel of the buffered image data; and
    determining of, for each pixel, information associated with B based on data from the $0^{th}$ bit to a $7^{th}$ bit, information associated with G based on data from an $8^{th}$ bit to a $15^{th}$ bit, and information associated with R based on data from a $16^{th}$ bit to the $23^{rd}$ bit, so as to determine, for each pixel, RGB information associated with the buffered image data.

9. The apparatus of claim 8, wherein the preliminary compensation value is obtained by adding values set, based on a four-bit unit, with respect to the data from the $0^{th}$ bit to the $23^{rd}$ bit.

10. The apparatus of claim 7, wherein the controller determines a compensation voltage value corresponding to the compensation value based on a predetermined table, and determines the residual quantity of the battery by adding the measured voltage value and the compensation voltage value.

11. The apparatus of claim 7, wherein the controller notifies information corresponding to the determined residual quantity of the battery.

12. The apparatus of claim 11, wherein the information includes at least one of visual information and auditory information.

13. A portable terminal having a display of the type having an active matrix organic light emitting diode (AMOLED) panel and a battery, comprising:
    a memory having a frame buffer; and
    a controller for measuring a voltage value of the battery to determine a preliminary compensation value by determining RGB information associated with image data buffered in the frame buffer for each pixel, for calculating a compensation value by adding preliminary compensation values of all pixels, and for determining a residual quantity of a battery based on the measured voltage value and the compensation value.

14. The terminal of claim 13, wherein the controller further determines data from a $0^{th}$ bit to a $23^{rd}$ bit from among data from the $0^{th}$ bit to a $32^{nd}$ bit of each pixel of the buffered image data; and further determines, for each pixel, information associated with B based on data from the $0^{th}$ bit to a $7^{th}$ bit, information associated with G based on data from an $8^{th}$ bit to a $15^{th}$ bit, and information associated with R based on data from a $16^{th}$ bit to the $23^{rd}$ bit, so as to determine, for each pixel, RGB information associated with the buffered image data.

15. The terminal of claim 14, wherein the preliminary compensation value is obtained by adding values set, based on a four-bit unit, with respect to the data from the $0^{th}$ bit to the $23^{rd}$ bit.

16. The terminal of claim 13, wherein the controller determines a compensation voltage value corresponding to the compensation value based on a predetermined table, and determines the residual quantity of the battery by adding the measured voltage value and the compensation voltage value.

17. The terminal of claim 13, wherein the controller notifies information corresponding to the determined residual quantity of the battery.

18. The terminal of claim 14, wherein the information includes at least one of visual information and auditory information.

* * * * *

UNITED STATES PATENT AND TRADEMARK OFFICE
CERTIFICATE OF CORRECTION

PATENT NO.       : 9,000,729 B2                                    Page 1 of 1
APPLICATION NO.  : 13/675222
DATED            : April 7, 2015
INVENTOR(S)      : Jin-Kyu Kim It is certified that error appears in the above-identified patent and that said Letters Patent is hereby corrected as shown below:

In the Claims
Column 9, Claim 2, Line 44 should read as follows:
--...to a 32nd bit...--

Signed and Sealed this
Seventh Day of July, 2015

Michelle K. Lee
*Director of the United States Patent and Trademark Office*